(12) United States Patent
Lee et al.

(10) Patent No.: US 9,171,847 B1
(45) Date of Patent: Oct. 27, 2015

(54) SEMICONDUCTOR STRUCTURE

(71) Applicant: INOTERA MEMORIES, INC., Taoyuan (TW)

(72) Inventors: Tzung-Han Lee, Taipei (TW); Neng-Tai Shih, New Taipei (TW); Yaw-Wen Hu, Taoyuan County (TW)

(73) Assignee: INOTERA MEMORIES, INC., Hwa-Ya Technology Park Kueishan, Taoyuan (TW)

( * ) Notice: Subject to any disclaimer, the term of this patent is extended or adjusted under 35 U.S.C. 154(b) by 0 days.

(21) Appl. No.: 14/505,490

(22) Filed: Oct. 2, 2014

(51) Int. Cl.
*H01L 29/66* (2006.01)
*H01L 27/108* (2006.01)
*H01L 27/088* (2006.01)
*H01L 29/08* (2006.01)
*H01L 29/423* (2006.01)
*H01L 29/49* (2006.01)

(52) U.S. Cl.
CPC ........ *H01L 27/10823* (2013.01); *H01L 27/088* (2013.01); *H01L 29/0847* (2013.01); *H01L 29/4236* (2013.01); *H01L 29/4966* (2013.01)

(58) Field of Classification Search
USPC ............... 257/216, 396, E27.091, E29.2, 257/E29.257, E29.26, E29.321, E29.233, 257/E29.27
See application file for complete search history.

(56) References Cited

FOREIGN PATENT DOCUMENTS

| TW | 452831 | 9/2001 |
|----|--------|--------|
| TW | I224394 | 11/2004 |
| TW | I323938 | 4/2010 |

*Primary Examiner* — Timor Karimy
(74) *Attorney, Agent, or Firm* — Winston Hsu; Scott Margo

(57) ABSTRACT

A semiconductor structure includes a semiconductor substrate, an active area in the semiconductor substrate, two trenches intersecting the active area to thereby divide the active area into a source region and two drain regions spaced apart from the source region, a saddle-shaped N+/N-/N+ structure in the source region of the active area; and two N+ drain doping regions in the two drain regions, respectively.

10 Claims, 7 Drawing Sheets

SEMICONDUCTOR STRUCTURE

BACKGROUND OF THE INVENTION

1. Field of the Invention

The present invention relates generally to a semiconductor structure. More particularly, the present invention relates to an improved semiconductor memory device capable of suppressing wordline-wordline (WL-WL) disturb and/or bitline-bitline (BL-BL) coupling during the operation of the memory device. A method of making the semiconductor structure is also disclosed.

2. Description of the Prior Art

Memory cell layouts are constantly miniaturized to be in accordance with product demands and the trends of high integration, high performance, and low power consumption.

One conventional dynamic random access memory (DRAM) layout includes wordlines that are perpendicular to the bitlines. Two wordlines may pass a same active area for forming two transistors in the same active area. The lengthwise direction of the active area may intersect with the wordlines at an acute angle. A bitline contact plug is located between the two transistors and electrically connected to a bitline. The bitline is electrically coupled to a source doping region that is commonly shared by the two transistors.

However, the above-described DRAM configuration suffers from so-called wordline-wordline (WL-WL) disturb failures when the operation state of one of the adjacent cells changes the state of information stored in the other of the adjacent cells. In the field of DRAM technology, there is a need for an improved semiconductor structure that is capable of reducing the WL-WL disturb failures.

SUMMARY OF THE INVENTION

According to an aspect of the present invention, there is provided a semiconductor structure including a semiconductor substrate, an active area in the semiconductor substrate, two trenches intersecting the active area to thereby divide the active area into a source region and two drain regions spaced apart from the source region, a saddle-shaped N+/N−/N+ structure in the source region of the active area; and two N+ drain doping regions in the two drain regions, respectively.

According to one embodiment of the invention, two trench gates are buried in lower portions of the two trenches respectively. The two trench gates may comprise a titanium nitride (TiN) layer and a tungsten (W) layer. A dielectric layer fills the upper portions of the two trenches.

According to one embodiment of the invention, the saddle-shaped N+/N−/N+ structure comprises an N+ source doping region, two N+ extension regions under the N+ source doping region, and an N− region under the N+ source doping region and sandwiched between the two N+ extension regions. The two N+ extension regions extend downwardly along two sidewalls facing each other of the trenches, respectively.

According to one embodiment of the invention, the two N+ extension regions partially overlap with the trench gates.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above and other aspects and features of the present invention will become apparent by describing in detail exemplary embodiments thereof with reference to the attached drawings, in which.

Figure 1:
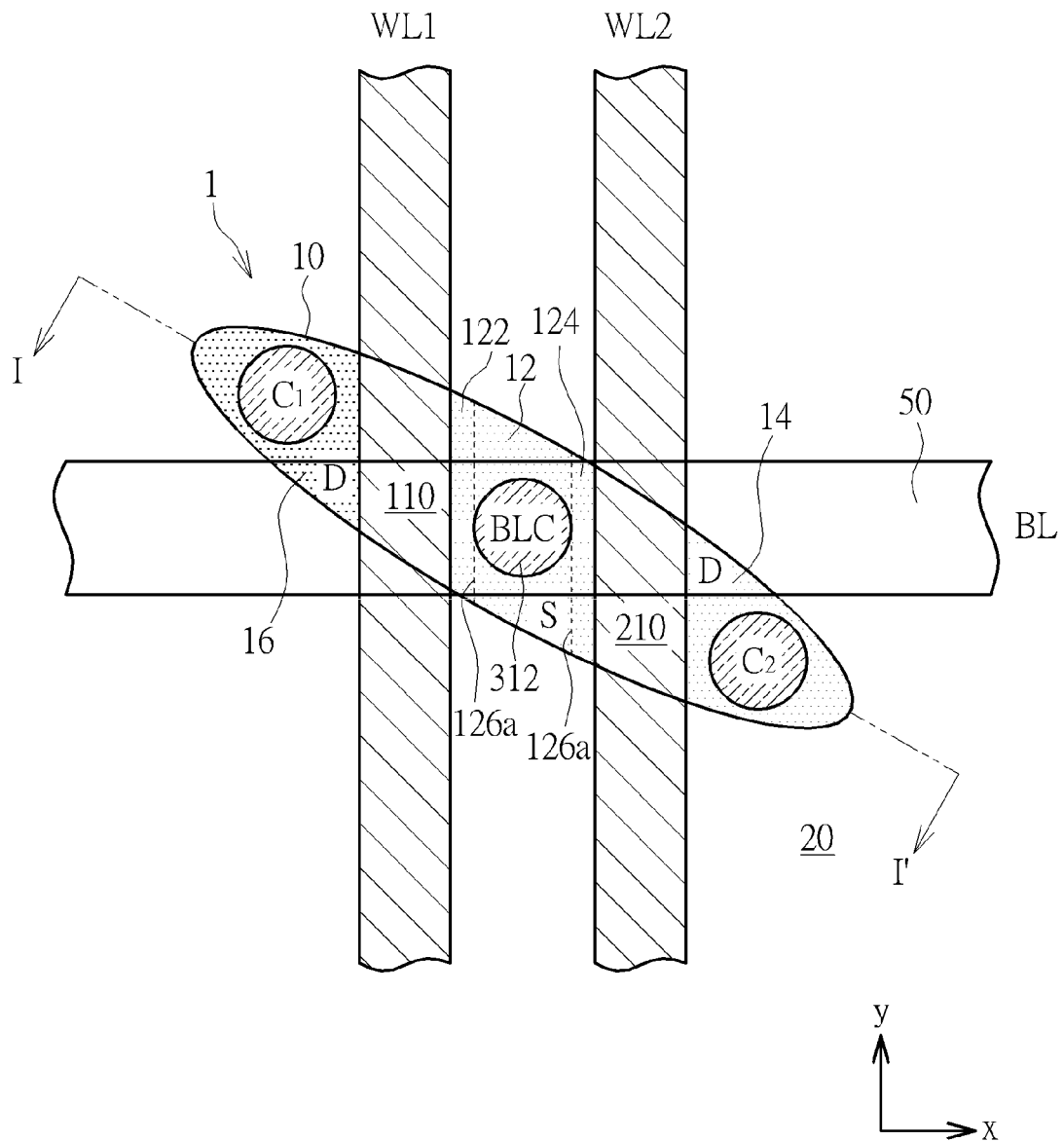
FIG. 1 is a top view of an exemplary semiconductor structure in accordance with one embodiment of the invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

Figure 2:
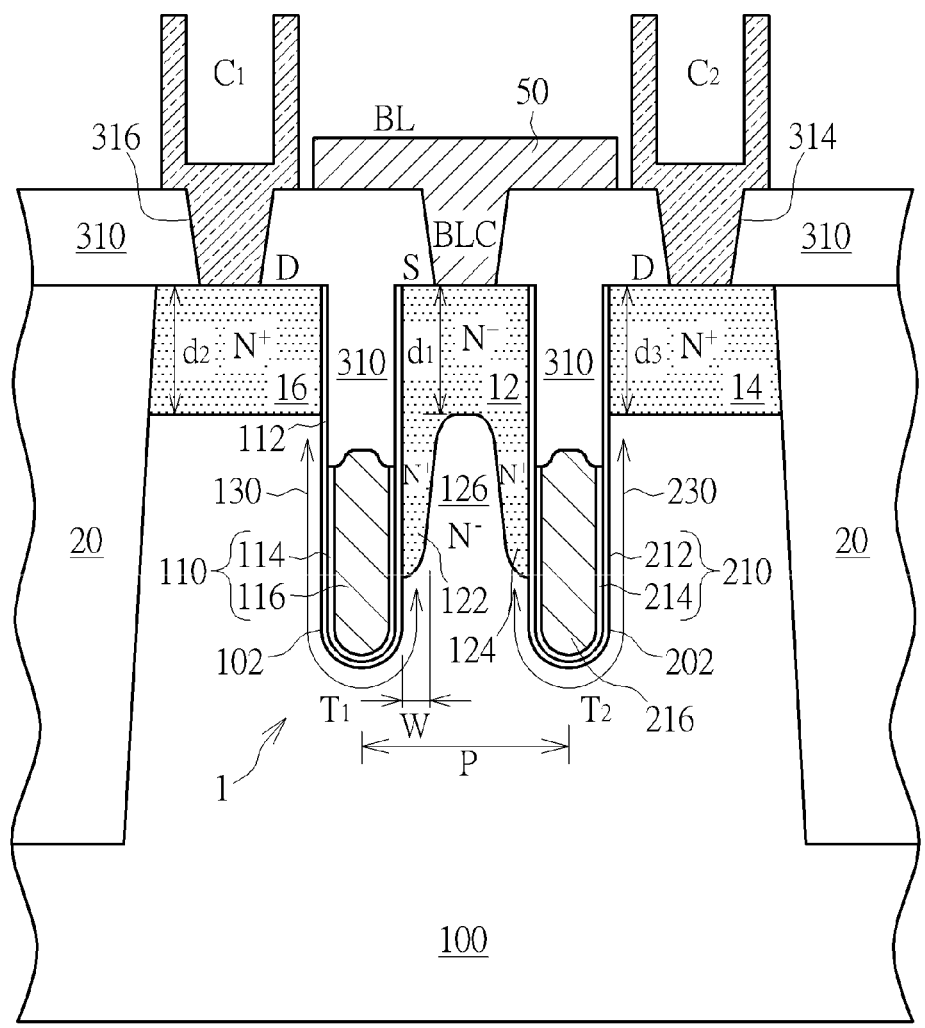
FIG. 2 is a schematic, cross-sectional diagram taken along line I-I' of FIG. 1.

Please refer to FIG. 1 and FIG. 2. FIG. 1 is a top view of an exemplary semiconductor structure 1 in accordance with one embodiment of the invention. FIG. 2 is a schematic, cross-sectional diagram taken along line I-I' of FIG. 1. As shown in FIG. 1 and FIG. 2, the semiconductor structure 1 is fabricated in an active area 10 surrounded by an isolation region 20 such as a shallow trench isolation (STI) region. The semiconductor structure 1 comprises two serially connected transistors T1 and T2 embedded in the active area 10. The transistors T1 and T2 are also known as trench gate transistors having buried gates and recessed channels. It is to be understood that other active areas in the memory array are omitted for the sake of simplicity. The conductivity type of each diffusion region is for illustration purposes.

As can be seen in FIG. 1, two parallel wordlines WL1 and WL2 may pass through the active area 10 and may divide the active area 10 into three parts: one source region (S) and two drain regions (D), wherein the source region (S) is located between the two parallel wordlines WL1 and WL2. The two parallel wordlines WL1 and WL2 may extend along a first direction, for example, the reference y-axis, and the two parallel wordlines WL1 and WL2 may intersect the lengthwise direction of the elongate active area 10 at an acute angle. The two parallel wordlines WL1 and WL2 are buried in the semiconductor substrate 100. The semiconductor substrate 100 may include, but not limited to, a P type silicon substrate.

As shown in FIG. 1 and FIG. 2, an N+ source doping region 12 is formed in the source region (S). An N+ drain doping region 14 and an N+ drain doping region 16 are formed in the drain regions (D) opposite to the N+ source doping region 12. The transistor T1 comprises a trench gate 110 situated only at the lower portion of the trench 102. The upper portion of the trench 102 is filled with a dielectric layer 310. According to the embodiment, the trench gate 110, which is part of the WL1, may comprise a titanium nitride (TiN) layer 114 and a tungsten (W) layer 116. It is understood that other gate materials may be used. A gate dielectric layer 112 such as a silicon oxide layer is provided at least between the trench gate 110 and the semiconductor substrate 100. The transistor T1 further comprises the N+ drain doping region 16 and the N+ source doping region 12.

Likewise, the transistor T2 comprises a trench gate 210 situated only at the lower portion of the trench 202. The upper portion of the trench 202 is filled with the dielectric layer 310. According to the embodiment, the trench gate 210, which is part of the WL2, may comprise a titanium nitride (TiN) layer 214 and a tungsten (W) layer 216. It is understood that other gate materials may be used. A gate dielectric layer 212 such as a silicon oxide layer is provided at least between the trench gate 210 and the semiconductor substrate 100. The transistor T2 further comprises the N+ drain doping region 16 and the N+ source doping region 12. The N+ source doping region 12 is commonly shared by the two trench gate transistors T1 and T2. According to the embodiment, the pitch P between the two adjacent trenches 102 and 104 is denoted by P, wherein P may range between 20 nm and 30 nm.

It is one germane feature of the invention that the N+ source doping region 12 comprises two N+ extension regions 122 and 124, which extend downwardly along a sidewall of the trench 102 and a sidewall of the trench 202 to partially overlap with the trench gate 110 and 210, respectively. For example, the N+ extension regions 122 and 124 may only overlap with ⅓~½ of the trench gates 110 and 210, respectively. According to the embodiment, an N− region 126 may be disposed in the pocket region sandwiched between the two N+ extension regions 122 and 124, thereby forming an N+/N− junction 126a between the two trenches 102 and 202.

According to the embodiment, the N+ source doping region 12 has junction depth d1 (vertical distance between the main surface of the semiconductor substrate and the N+/N− junction 126a), which is substantially equal to the junction depth d2 of the N+ drain doping region 16 and the junction depth d3 of the N+ drain doping region 14. That is, in this embodiment, the N+ source doping region 12, the N+ drain doping region 14 and the N+ drain doping region 16 have substantially the same junction depth. According to the embodiment, the N+ extension regions 122 and 124 both have a lateral junction depth w (laterally from the sidewall of the trenches 102 and 202 to the N+/N− junction), wherein w may range between 3 nm and 5 nm.

As shown in FIG. 2, a recessed channel 130 is defined between the N+ drain doping region 16 and the N+ extension regions 122. A recessed channel 230 is defined between the N+ drain doping region 14 and the N+ extension regions 124. A bit line contact (BLC) 312 may be formed in the dielectric layer 310 to electrically connect the N+ source doping region 12 to an overlying bit line (BL) 50 that extends along a second direction, for example, the reference x-axis as shown in FIG. 1. A capacitor (or a storage element) C1 and a capacitor C2 may be formed in or on the dielectric layer 310 to electrically couple to the N+ drain doping region 16 and the N+ drain doping region 14 respectively.

To sum up, the present invention features a unique saddle-shaped N+/N−/N+ structure 12/122/126/124 embedded in the source region (S) of the semiconductor structure 1 comprising the two serially connected trench gate transistors T1 and T2. The saddle-shaped N+/N−/N+ structure 12/122/126/124 is located between the two adjacent trenches 102 and 202. By providing such configuration, the wordline-wordline (WL-WL) disturb can be suppressed and the bitline-bitline (BL-BL) coupling can be reduced.

Figure 3:
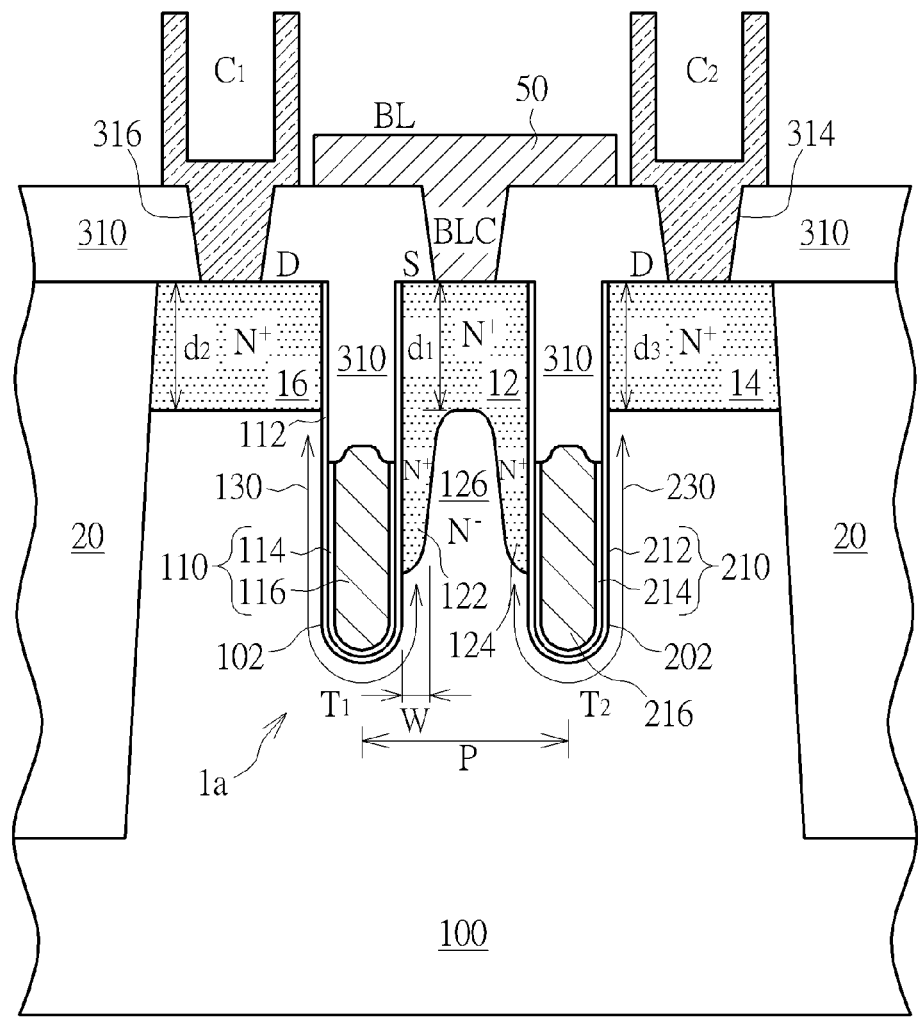
FIG. 3 is a schematic, cross-sectional diagram showing an exemplary semiconductor structure 1a in accordance with another embodiment of the invention.

Please refer to FIG. 3. FIG. 3 is a schematic, cross-sectional diagram showing an exemplary semiconductor structure 1a in accordance with another embodiment of the invention. As shown in FIG. 3, the difference between the semiconductor structure 1a in FIG. 3 and the semiconductor structure 1 in FIG. 2 is that the N+ source doping region 12, the N+ drain doping region 14 and the N+ drain doping region 16 of the semiconductor structure 1a have different junction depths. The junction depth d2 and d3 of the N+ source doping region 14/16 is shallower than the junction depth d1 of the N+ source doping region 12.

Figure 4:
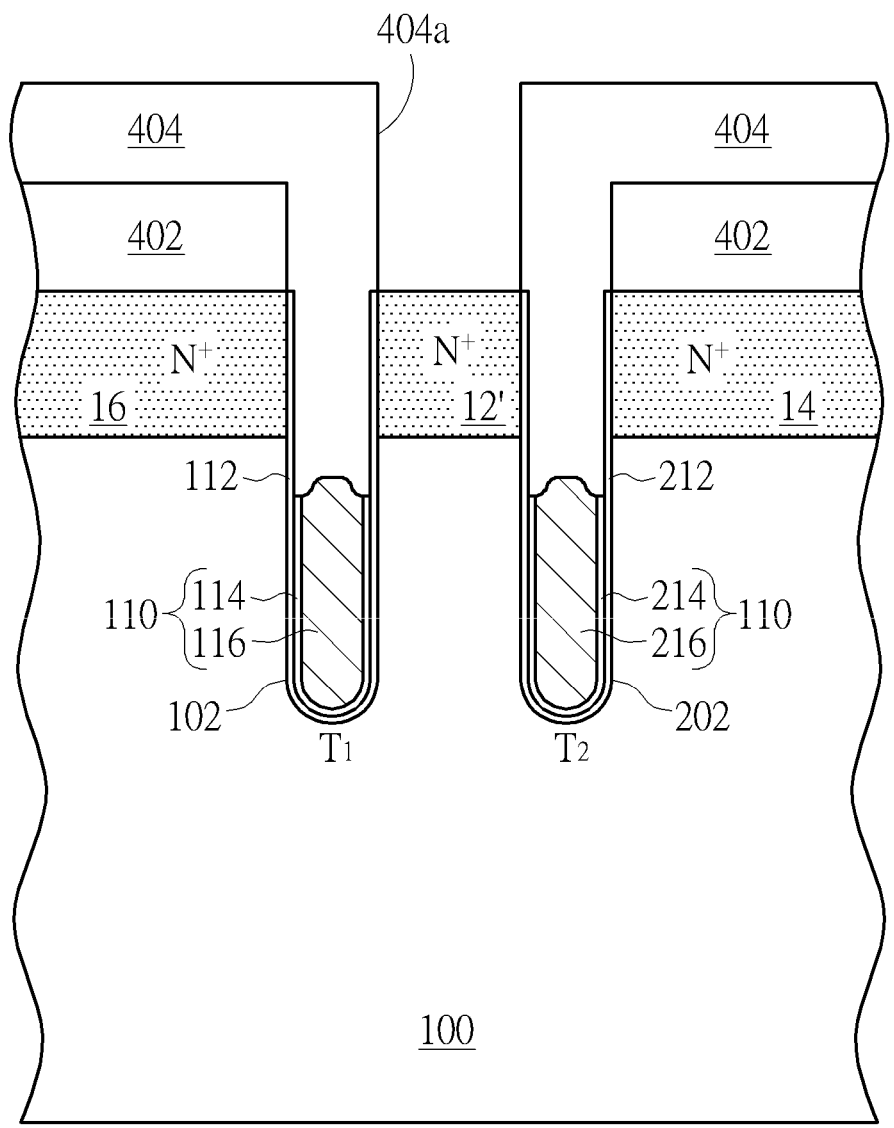
FIG. 4 to FIG. 7 demonstrate an exemplary method of making the semiconductor structure in FIG. 2.

FIG. 4 to FIG. 7 demonstrate an exemplary method of making the semiconductor structure 1 in FIG. 2. As shown in FIG. 4, after forming the trench gates 110 and 210 in the trenches 102 and 202, and the N+ doping regions 12', 14 and 16, a patterned dielectric layer 404 is formed on the hard mask layer 402. The patterned dielectric layer 404 may comprise a silicon nitride layer, but not limited thereto. The patterned dielectric layer 404 comprises an opening 404a that exposes the hard mask pattern directly formed on the N+ doping regions 12'. The hard mask pattern directly formed on the N+ doping regions 12' is removed through the opening 404a.

Figure 5:
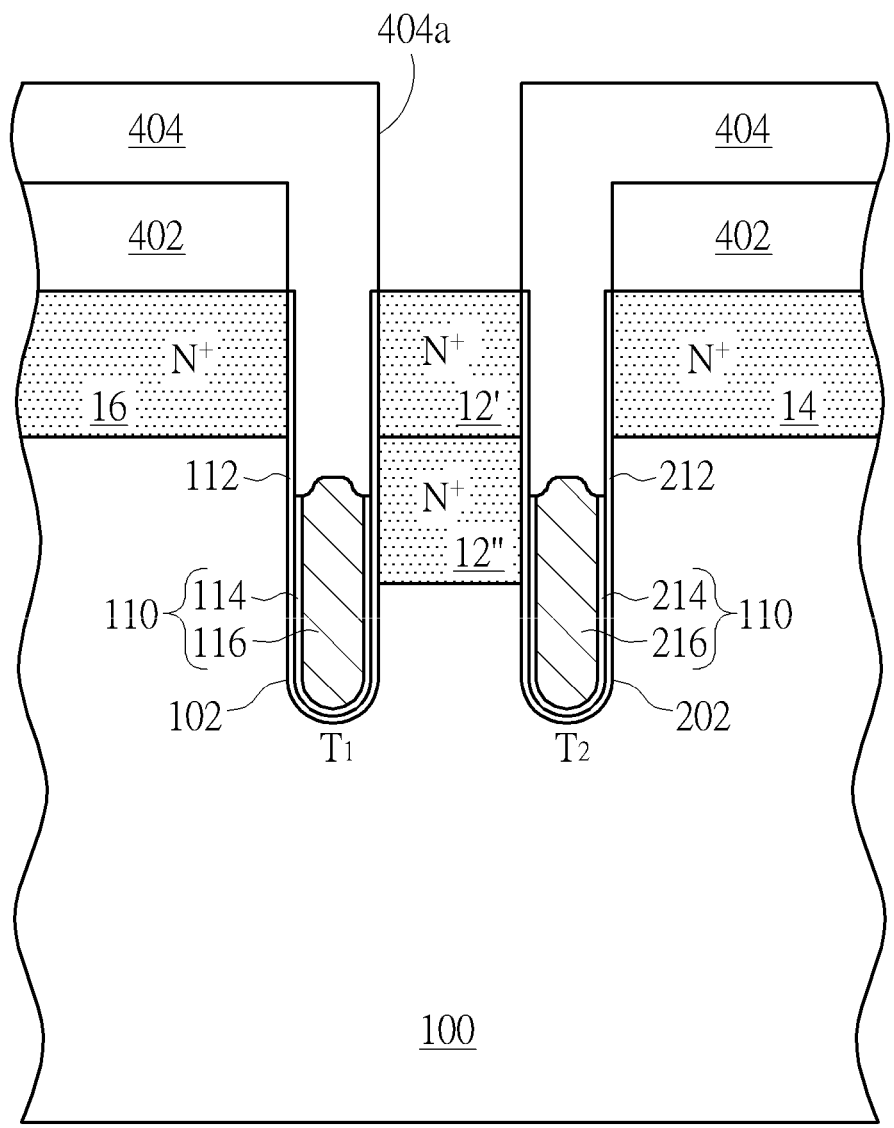

As shown in FIG. 5, an N+ doping regions 12" is formed in the semiconductor substrate 100 under the N+ doping regions 12'. The doping concentration of the N+ doping regions 12" may be equal to that of the N+ doping regions 12'. In other embodiments, the doping concentration of the N+ doping regions 12" may be different from that of the N+ doping regions 12'.

Figure 6:
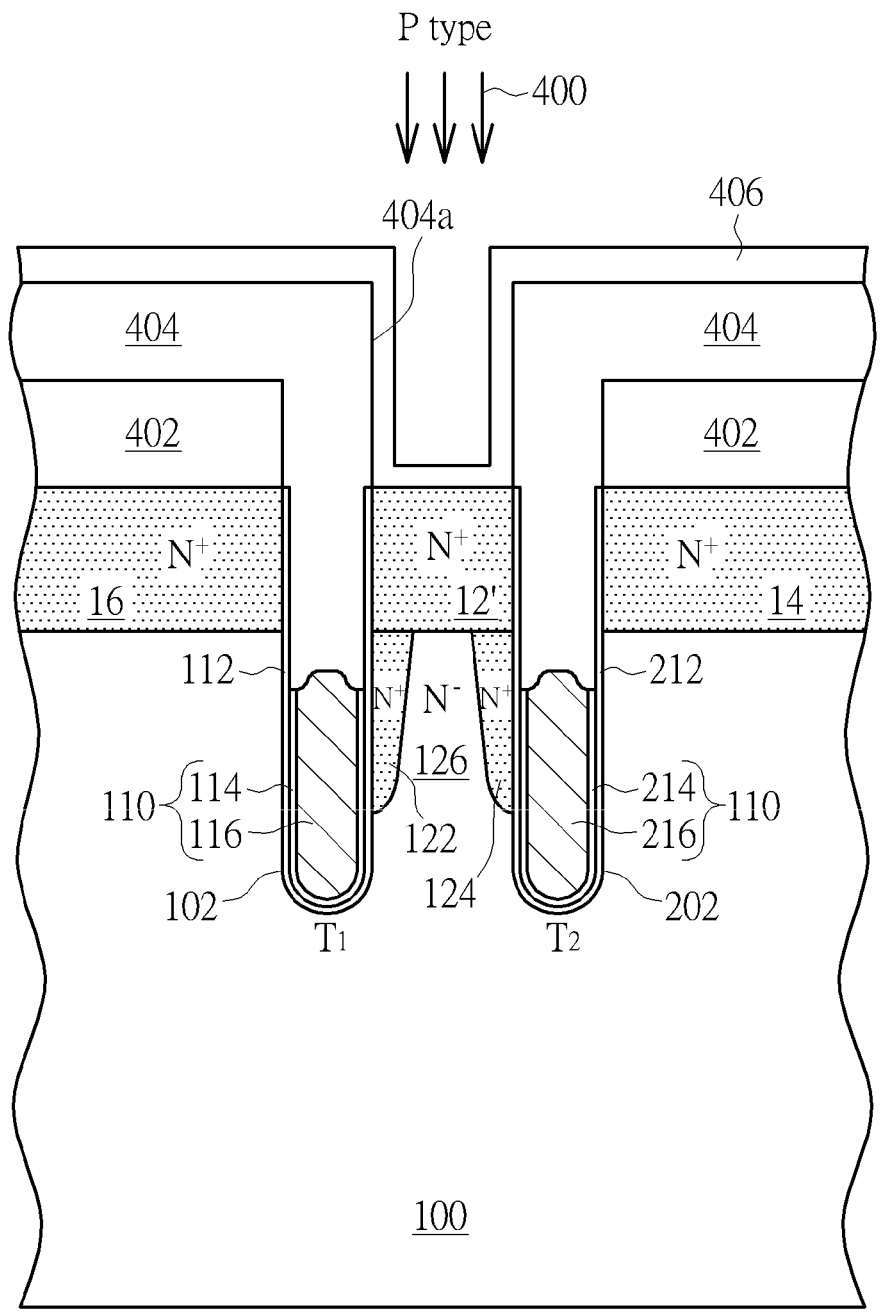

As shown in FIG. 6, a spacer layer 406 such as a silicon oxide layer may be deposited on the patterned dielectric layer 404. The spacer layer 406 conformally covers the patterned dielectric layer 404 and the interior surfaces of the opening 404a. Subsequently, a self-aligned ion implantation process 400 is carried out to implant P type dopants into the semiconductor substrate 100 through the shrunk opening 404a. The energy and the dosage of the self-aligned ion implantation process 400 are controlled such that the P type dopants can be implanted into a pre-determined depth under the N+ doping regions 12', whereby an N− region 126 can be formed between the two N+ extension regions 122 and 124.

Figure 7:
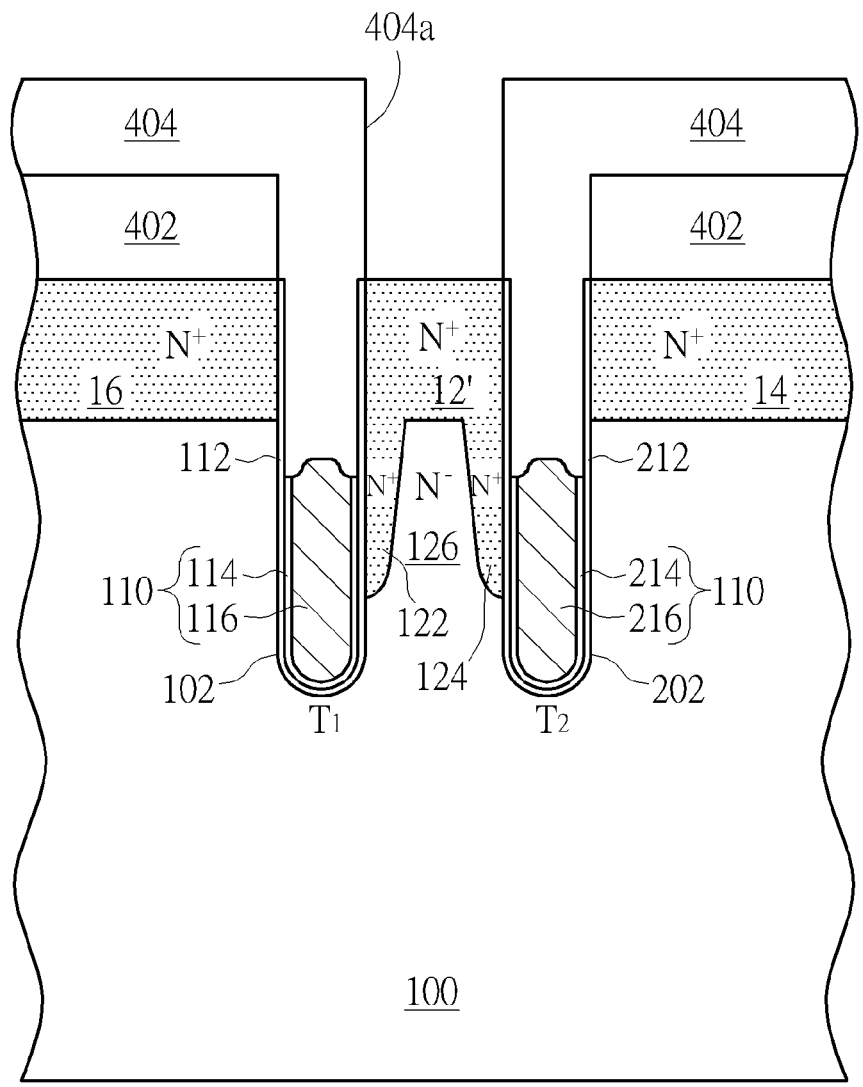

As shown in FIG. 7, subsequently, the spacer layer 406 may be removed. Optionally, a thermal drive-in process may be performed to thereby form the saddle-shaped N+/N−/N+ structure 12/122/126/124 embedded in the source region (S) of the semiconductor structure 1.

It is to be understood that the saddle-shaped N+/N−/N+ structure 12/122/126/124 may be formed by other methods. For example, the N+ extension regions 122 and 124 may be formed by tilt-angle ion implantation processes or gas diffusion processes in combination with a suitable mask pattern.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a semiconductor substrate;
    an active area in the semiconductor substrate;
    two trenches intersecting the active area to thereby divide the active area into a source region and two drain regions spaced apart from the source region;
    a saddle-shaped N+/N−/N+ structure in the source region of the active area; and
    two N+ drain doping regions in the two drain regions, respectively.

2. The semiconductor structure according to claim 1 further comprising two trench gates buried in lower portions of the two trenches respectively.

3. The semiconductor structure according to claim 2 wherein the saddle-shaped N+/N−/N+ structure comprises an N+ source doping region, two spaced apart N+ extension regions under the N+ source doping region, and an N− region under the N+ source doping region and sandwiched between the two N+ extension regions.

4. The semiconductor structure according to claim 3 wherein the two N+ extension regions partially overlap with the trench gates.

5. The semiconductor structure according to claim 3 wherein the two N+ extension regions extend downwardly along two sidewalls facing each other of the trenches, respectively.

6. The semiconductor structure according to claim 3 wherein the N+ source doping region and the two N+ drain doping regions have substantially a same junction depth.

7. The semiconductor structure according to claim 3 wherein the two N+ drain doping regions have a same junction depth that is shallower than that of the N+ source doping region.

8. The semiconductor structure according to claim 2 further comprising a dielectric layer filling upper portions of the two trenches.

9. The semiconductor structure according to claim 2 wherein two trench gates comprise a titanium nitride (TiN) layer and a tungsten (W) layer.

10. The semiconductor structure according to claim 1 further comprising a gate dielectric layer in the two trenches.

* * * * *